(12) United States Patent
Zhao et al.

(10) Patent No.: US 9,437,632 B2
(45) Date of Patent: Sep. 6, 2016

(54) IMAGE SENSOR AND MANUFACTURING METHOD THEREOF

(71) Applicant: GalaxyCore Shanghai Limited Corporation, Shanghai (CN)

(72) Inventors: Lixin Zhao, Shanghai (CN); Wenqiang Li, Shanghai (CN); Jie Li, Shanghai (CN); Ze Xu, Shanghai (CN)

(73) Assignee: GalaxyCore Shanghai Limited Corporation (CN)

( * ) Notice: Subject to any disclaimer, the term of this patent is extended or adjusted under 35 U.S.C. 154(b) by 0 days.

(21) Appl. No.: 14/419,888

(22) PCT Filed: Jun. 24, 2014

(86) PCT No.: PCT/CN2014/080560
§ 371 (c)(1),
(2) Date: Feb. 5, 2015

(87) PCT Pub. No.: WO2015/027741
PCT Pub. Date: Mar. 5, 2015

(65) Prior Publication Data
US 2016/0027826 A1    Jan. 28, 2016

(30) Foreign Application Priority Data

Aug. 30, 2013 (CN) .......................... 2013 1 0391161

(51) Int. Cl.
*H01L 29/49* (2006.01)
*H01L 27/146* (2006.01)

(52) U.S. Cl.
CPC ..... *H01L 27/14612* (2013.01); *H01L 27/1463* (2013.01); *H01L 27/14616* (2013.01); *H01L 27/14643* (2013.01); *H01L 27/14689* (2013.01)

(58) Field of Classification Search
CPC ................................................ H01L 27/14612
See application file for complete search history.

(56) References Cited

U.S. PATENT DOCUMENTS 6,511,883 B1    1/2003  Pan
7,008,815 B1    3/2006  Sze
(Continued)

FOREIGN PATENT DOCUMENTS

CN    1819225 A      8/2006
CN    101211940 A    7/2008
CN    101752395 A    6/2010
CN    103413818 A    11/2013

OTHER PUBLICATIONS

International Search Report for corresponding International Application No. PCT/CN02014/080560.
(Continued)

*Primary Examiner* — Michael Shingleton
(74) *Attorney, Agent, or Firm* — Swanson & Bratschun, L.L.C.

(57) ABSTRACT

An image sensor and a manufacturing method thereof are provided. The image sensor includes: a photo diode; a first-conductive-type isolating layer; a second-conductive-type lightly-doped region formed in the first-conductive-type semiconductor substrate; a first-conductive-type lightly-doped region formed under the second-conductive-type lightly-doped region, where the second-conductive-type lightly-doped region is isolated from the second-conductive-type region by the first-conductive-type lightly-doped region; a gate structure of a transfer transistor; and a floating diffusion region which is second-conductive-type heavily-doped. In the image sensor, the second-conductive-type lightly-doped region is formed to be connected with the floating diffusion region, thus, a distance between the floating diffusion region and the photo diode may be reduced which may enable photo-induced carriers to be transmitted from the photo diode to the floating diffusion region more rapidly, and further increase the transmission efficiency of the photo-induced carriers.

6 Claims, 2 Drawing Sheets

(56) References Cited

U.S. PATENT DOCUMENTS

2009/0166737 A1* 7/2009 Kim ............... H01L 29/665
257/344
2010/0127321 A1* 5/2010 Ko ............... H01L 29/0653
257/327

OTHER PUBLICATIONS

Translation of the Written Opinion of the International Searching Authority for corresponding International Application No. PCT/CN02014/080560.

* cited by examiner

IMAGE SENSOR AND MANUFACTURING METHOD THEREOF

CROSS-REFERENCE TO RELATED APPLICATIONS

The present application is a Section 371 National Stage Application of International Application No. PCT/CN2014/080560, filed on Jun. 24, 2014, which claims priority to Chinese patent application No. 201310391161.3, filed on Aug. 30, 2013, and entitled "IMAGE SENSOR AND MANUFACTURING METHOD THEREOF", and the entire disclosure of which is incorporated herein by reference.

TECHNICAL FIELD

The present disclosure generally relates to semiconductor technology field, and more particularly, to an image sensor and a manufacturing method thereof.

BACKGROUND

An image sensor is a semiconductor device which is configured for capturing radiation and converting the sensed radiation into electric signals. Generally, an image sensor includes a Photo Diode (PD) which is photosensitive and a logic circuit adapted to convert light sensed by the PD into electric signals. The logic circuit generally includes a transfer transistor, and the PD is connected with a Floating Diffusion (FD) region through the transfer transistor. When the image sensor operates, a transfer transistor is opened, and thus, photo-induced carriers in the PD can be transmitted into the FD region through a channel in the transfer transistor.

In an existing image sensor, transmission efficiency of photo-induced carriers being transmitted from a PD into a FD region is relatively low. More information about transmission efficiency of photo-induced carriers in an image sensor can be found in a Chinese patent application publication No. CN101752395A, published on Jun. 23, 2014.

Therefore, an image sensor and a manufacturing method thereof are required, to improve transmission efficiency of photo-induced carriers.

SUMMARY

In embodiments of the present disclosure, an image sensor and a manufacturing method thereof are provided, which improve transmission efficiency of photo-induced carriers.

In an embodiment, a method for manufacturing an image sensor is provided, including:

A: forming a second-conductive-type region in a first-conductive-type semiconductor substrate to form a photo diode, where the second-conductive-type region serves as a region for collecting photo-induced carriers, and forming a first-conductive-type isolating layer above the photo diode in the first-conductive-type semiconductor substrate;

B: forming a second-conductive-type lightly-doped region and a first-conductive-type lightly-doped region under the second-conductive-type lightly-doped region, where the second-conductive-type lightly-doped region is isolated from the second-conductive-type region by the first-conductive-type lightly-doped region;

C: forming a gate structure of a transfer transistor on a surface of the first-conductive-type semiconductor substrate by a deposition process and a patterning process, where the gate structure covers at least a portion of the second-conductive-type lightly-doped region; and D: forming a floating diffusion region which is second-conductive-type heavily-doped by a doping process, the floating diffusion region contacting with the second-conductive-type lightly-doped region.

In some embodiments, in the step A, the second-conductive-type region and the first-conductive-type isolating layer may have self-alignment feature.

In some embodiments, in the step B, the second-conductive-type lightly-doped region and the first-conductive-type lightly-doped region may have self-alignment feature.

In some embodiments, in the step B, photoresist may be coated on the surface of the first-conductive-type semiconductor substrate, a photolithography process may be performed on the photoresist using a first mask plate to expose and develop, and a doping process may be performed to a portion of the first-conductive-type semiconductor substrate, to form the first-conductive-type and second-conductive-type lightly-doped regions.

In some embodiments, in the step B, photoresist may be coated on the surface of the first-conductive-type semiconductor substrate, a photolithography process may be performed on the photoresist using a first mask plate to expose and develop to form a patterned photoresist, an etching process may be performed by taking the patterned photoresist as a mask to form a groove on the surface of the first-conductive-type semiconductor substrate, a doping process may be performed to a first portion of the first-conductive-type semiconductor substrate which corresponds to the groove to form the conductive-type lightly-doped region, an inner side of the groove may be etched to enlarge the groove, and a doping process may be performed to a second portion of the first-conductive-type semiconductor substrate which corresponds to the enlarged groove to form the second-conductive-type lightly-doped region.

In some embodiments, the gate structure may cover the first-conductive-type isolating layer and the second-conductive-type lightly-doped region.

In some embodiments, in the step C, forming the gate structure includes: forming a gate oxide layer, a gate layer covering the gate oxide layer, gate sidewalls disposed on two sides of the gate layer in turn by a thermal oxidation process and a patterning process.

In some embodiments, when the first-conductive-type is P type, the second-conductive-type is N type; and when the first-conductive-type is N type, the second-conductive-type is P type.

In some embodiments, the photo-induced carriers may include electrons or electron holes.

In an embodiment, an image sensor is provided, including:

a photo diode, which is formed by forming a second-conductive-type region in a first-conductive-type semiconductor substrate, where the second-conductive-type region serves as a region for collecting photo-induced carriers;

a first-conductive-type isolating layer formed above the photo diode in the first-conductive-type semiconductor substrate;

a second-conductive-type lightly-doped region formed in the first-conductive-type semiconductor substrate;

a first-conductive-type lightly-doped region formed under the second-conductive-type lightly-doped region, where the second-conductive-type lightly-doped region is isolated from the second-conductive-type region by the first-conductive-type lightly-doped region;

a gate structure of a transfer transistor, which corresponds to the first-conductive-type isolating layer, is formed on a surface of the first-conductive-type semiconductor substrate, and covers at least a portion of the second-conductive-type lightly-doped region; and a floating diffusion region which is second-conductive-type heavily-doped, where the floating diffusion region contacts with the second-conductive-type lightly-doped region and is formed on one side of the second-conductive-type lightly-doped region which is away from the first-conductive-type isolating layer.

In some embodiments, the second-conductive-type region and the first-conductive-type isolating layer may have self-alignment feature.

In some embodiments, photoresist may be coated on the surface of the first-conductive-type semiconductor substrate, a photolithography process may be performed on the photoresist using a first mask plate to expose and develop, and a doping process may be performed to a portion of the first-conductive-type semiconductor substrate, to form the first-conductive-type and second-conductive-type lightly-doped regions.

In some embodiments, photoresist may be coated on the surface of the first-conductive-type semiconductor substrate, a photolithography process may be performed on the photoresist using a first mask plate to expose and develop to form a patterned photoresist, an etching process may be performed by taking the patterned photoresist as a mask to form a groove on the surface of the first-conductive-type semiconductor substrate, a doping process may be performed to a first portion of the first-conductive-type semiconductor substrate which corresponds to the groove to form the first-conductive-type lightly-doped region, an inner side of the groove may be etched to enlarge the groove, and a doping process may be performed to a second portion of the first-conductive-type semiconductor substrate which corresponds to the enlarged groove to form the second-conductive-type lightly-doped region.

In some embodiments, the gate structure may cover the first-conductive-type isolating layer and the second-conductive-type lightly-doped region.

In some embodiments, the gate structure may be formed by performing a thermal oxidation process and a patterning process to form a gate oxide layer, a gate layer covering the gate oxide layer, gate sidewalls disposed on two sides of the gate layer in turn.

In some embodiments, when the first-conductive-type is P type, the second-conductive-type is N type; and when the first-conductive-type is N type, the second-conductive-type is P type.

In some embodiments, the photo-induced carriers may include electrons or electron holes.

Embodiments of the present disclosure may have following disadvantages. In embodiments of the present disclosure, a second-conductive-type lightly-doped region is formed to be connected with a floating diffusion region. Thus, when transmitted in a channel, photo-induced carriers are prone to be attracted by the second-conductive-type lightly-doped region and the floating diffusion region due to electric potential, which may increase the transmission efficiency of the photo-induced carriers. Besides, the second-conductive-type lightly-doped region may serve as a "bridge" to shorten a distance between the floating diffusion region and a photo diode. And this may enable the photo-induced carriers to be transmitted from the photo diode to the floating diffusion region more rapidly, which may further increase transmission efficiency of the photo-induced carriers.

Further, a first-conductive-type isolating ring is formed to separate photo diodes from each other, which may avoid signal crosstalk.

DETAILED DESCRIPTION

In existing image sensors, a floating diffusion region is a heavily-doped region, thus, transmission efficiency of photo-induced carriers is relatively low.

In an embodiment of present disclosure, an image sensor is provided. In the image sensor, a second-conductive-type lightly-doped region is formed under a gate in a first-conductive-type semiconductor substrate and contacts with a floating diffusion region, namely, the second-conductive-type lightly-doped region may act as an epitaxy part of the floating diffusion region. Thus, when transmitted in a channel, photo-induced carriers are prone to be attracted by the second-conductive-type lightly-doped region and the floating diffusion region due to electric potential in the channel, which may increase the transmission efficiency of the photo-induced carriers. Besides, the second-conductive-type lightly-doped region may serve as a "bridge" to shorten a distance between the floating diffusion region and a photo diode. And this may enable the photo-induced carriers to be transmitted to the floating diffusion region more rapidly, which may further increase transmission efficiency of the photo-induced carriers in the image sensor and reduce signal delay.

In order to clarify the objects, characteristics and advantages of the disclosure, embodiments of present disclosure will be described in detail in conjunction with accompanying drawings.

In an embodiment, a method for manufacturing an image sensor is provided. Referring to FIGS. 1 to 4, the method includes steps A, B, C and D. Hereinafter, the method is described in detail in conjunction with the figures.

Figure 1:
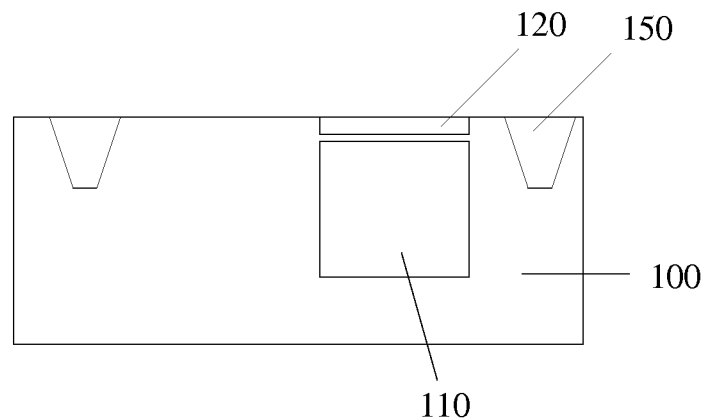
FIGS. 1 to 4 illustrate intermediate structures of a method for manufacturing an image sensor according to an embodiment of the present disclosure.

In the step A, referring to FIG. 1, a second-conductive-type region 110 is formed in a first-conductive-type semiconductor substrate 100 to form a photo diode, where the second-conductive-type region 110 serves as a region for collecting photo-induced carriers, and a first-conductive-type isolating layer 120 is formed above the photo diode in the first-conductive-type semiconductor substrate 100.

In some embodiments, the first-conductive-type semiconductor substrate 100 may be a silicon substrate, a semiconductor substrate including an epitaxy layer, or a Silicon-On-Insulator (SOI) substrate. In some embodiments, the first-conductive-type semiconductor substrate 100 may include at least one selected from silicon carbide, gallium arsenide, indium arsenide, indium phosphide, silicon germanium, silicon germanium carbide, gallium arsenide phosphide and gallium indium phosphide.

In some embodiments, the photo diode is formed by forming the second-conductive-type region 110 in the first-conductive-type semiconductor substrate 100. The second-conductive-type region 110 may serve as the region for collecting photo-induced carriers. In some embodiments, the photo-induced carriers may include electrons or electron holes. In the embodiment, the photo-induced carriers include electrons.

In the embodiment, the photo-induced carriers include electrons. Thus, the first-conductive-type is P type, and the second-conductive-type is N type. Therefore, the first-conductive-type semiconductor substrate 100 may be doped with P-type dopant, such as boron. In some embodiments, the photo-induced carriers may include electric holes, thus, the first-conductive-type is N type, and the second-conductive-type is P type.

In some embodiments, before the second-conductive-type region 110 is formed, a first-conductive-type isolating ring 150 may be formed to surround the photo diodes to be formed subsequently. A method for forming the first-conductive-type isolating ring 150 may include: forming a photoresist layer (not shown in figures) including an opening on a surface of the first-conductive-type semiconductor substrate 100, where the photoresist layer may be positive or negative, and a position of the opening corresponds to a position of the first-conductive-type isolating ring 150 to be formed; by taking the photoresist layer as a mask, injecting first-conductive-type ions into the opening to form the first-conductive-type isolating ring 150 which surrounds the photo diodes; and annealing the first-conductive-type isolating ring 150 to activate the injected first-conductive-type ions.

In some embodiments, when the second-conductive-type region 110 is formed, photoresist (not shown in figures) may be coated on the surface of the first-conductive-type semiconductor substrate 100, a photolithography process may be performed on the photoresist using a second mask plate (not shown in figures) to expose and develop to form a patterned photoresist, and a doping process may be performed to the first-conductive-type semiconductor substrate 100 by taking the patterned photoresist as a mask, to dope ions into the first-conductive-type semiconductor substrate 100 to form the second-conductive-type region 110, namely, the photo diode is formed.

In some embodiments, when the first-conductive-type isolating layer 120 is formed, a photolithography process may be performed using the second mask plate again and a doping process may be process, similarly with above embodiments, to form the first-conductive-type isolating layer 120. In some embodiments, the doping process may be an ion implantation process. The doped ions may include at least one selected from phosphorus ions, arsenic ions and antimony ions. Doping ion concentration of the first-conductive-type isolating layer 120 may be greater than that of the first-conductive-type semiconductor substrate 100 by one to two orders of magnitude.

It should be noted that, in some embodiments, photoresist may not be coated, and a mask plate is taken as a mask to perform a doping process, to form the photo diode and the first-conductive-type isolating layer 120.

In some embodiments, the photo diode and the first-conductive-type isolating layer 120 may be formed by other methods. In some embodiments, photoresist (not shown in figures) may be coated on the surface of the first-conductive-type semiconductor substrate 100, a photolithography process may be performed on the photoresist using the second mask plate (not shown in figures) to expose and develop to form a groove (not shown in figures) on the surface of the first-conductive-type semiconductor substrate 100, and a doping process may be performed to a first portion of the first-conductive-type semiconductor substrate 100 which corresponds to the groove to form the photo diode. An inner side of the groove may be etched to enlarge the groove, and a filling process may be performed to a second portion of the first-type conductive semiconductor substrate 100 which corresponds to the enlarged groove to form the first-conductive-type isolating layer 120. In some embodiments, the inner side of the groove may not be etched, instead, a portion of the inner side may be burned by using oxygen, which is one type of pre-treatment in the art (called descum).

In some embodiments, both the second-conductive-type region 110 and the first-conductive-type isolating layer 120 are formed using the second mask plate, thus, the photo diode and the first-conductive-type isolating layer 120 may have self-alignment feature.

Figure 2:
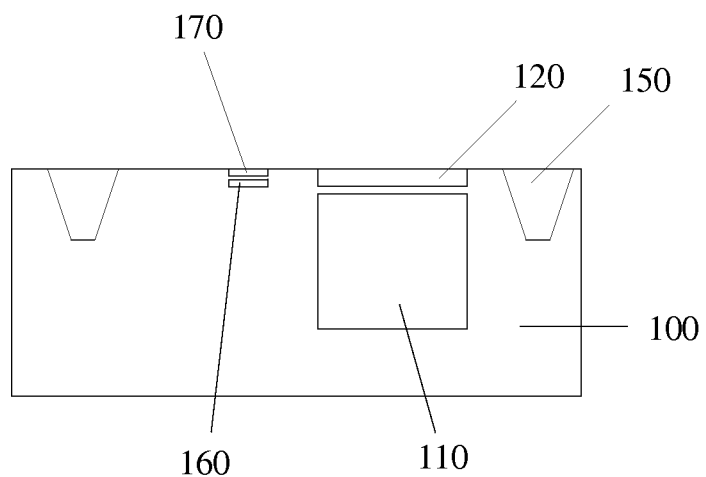

In the step B, referring to FIG. 2, a second-conductive-type lightly-doped region 170 and a first-conductive-type lightly-doped region 160 under the second-conductive-type lightly-doped region 170 are formed, where the second-conductive-type lightly-doped region 170 is isolated from the second-conductive-type region 110 by the first-conductive-type lightly-doped region 160.

In some embodiments, when the second-conductive-type lightly-doped region 170 and the first-conductive-type lightly-doped region 160 are formed, photoresist (not shown in figures) may be coated on the surface of the first-conductive-type semiconductor substrate 100, a photolithography process may be performed on the photoresist using a first mask plate (not shown in figures) to expose and develop, and a doping process may be performed to a portion of the first-conductive-type semiconductor substrate 100, to form the first-conductive-type lightly-doped region 160. Similarly, the second-conductive-type lightly-doped region 170 may be formed above the first-conductive-type lightly-doped region 160.

It should be noted that, in some embodiments, photoresist may not be coated, and a mask plate is taken as a mask to perform a doping process, to form the second-conductive-type lightly-doped region 170 and the first-conductive-type lightly-doped region 160.

In some embodiments, the second-conductive-type lightly-doped region 170 and the first-conductive-type lightly-doped region 160 may be formed by other methods. In some embodiments, photoresist (not shown in figures) may be coated on the surface of the first-conductive-type semiconductor substrate 100, a photolithography process may be performed on the photoresist using the first mask plate (not shown in figures) to expose and develop to form a groove (not shown in figures) on the surface of the first-conductive-type semiconductor substrate 100, a doping process may be performed to a third portion of the first-conductive-type semiconductor substrate 100 which corresponds to the groove to form the first-conductive-type lightly-doped region 160, an inner side of the groove may be etched to enlarge the groove, and a filling process may be performed to a fourth portion of the first-type conductive semiconductor substrate 100 which corresponds to the enlarged groove to form the second-conductive-type lightly-doped region 170.

In some embodiments, both the second-conductive-type lightly-doped region 170 and the first-conductive-type lightly-doped region 160 are formed using the first mask plate, thus, the photo diode and the first-conductive-type isolating layer 120 may have self-alignment feature.

Figure 3:
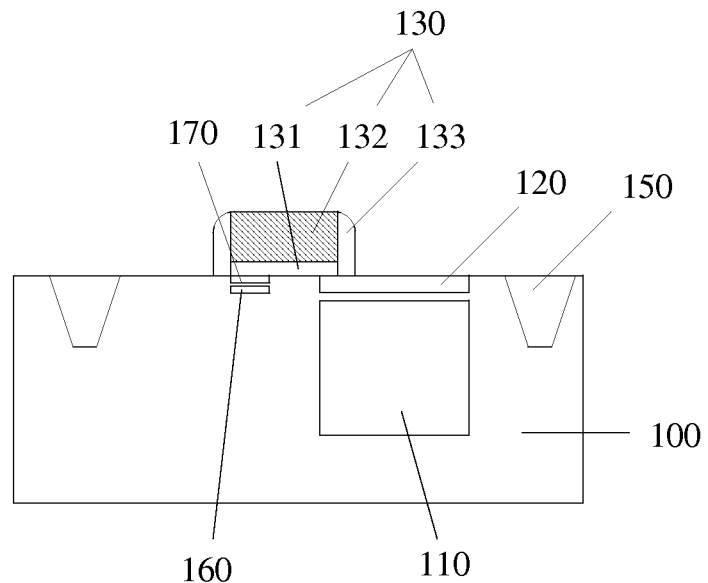

In the step C, referring to FIG. 3, a gate structure 130 of a transfer transistor is formed on a surface of the first-conductive-type semiconductor substrate 100 by a deposition process and a patterning process.

In some embodiments, when the gate structure is formed, an oxide layer (not shown in figures) may be formed by a thermal oxidation process, a polysilicon layer (not shown in figures) may be deposited on the oxide layer, a patterned photoresist layer (not shown in figures) may be formed on the polysilicon layer, the polysilicon layer and the oxide layer may be etched using a dry etching process or a wet etching process by taking the patterned photoresist layer as a mask, until a gate oxide layer 131 and a gate layer 132 covering the gate oxide layer 131 are formed, a sidewall material layer (not shown in figures) may be formed by a physical vapor deposition process, a chemical vapor deposition process or an atomic layer deposition process, and the sidewall material layer may be etched by a dry etching process to form a gate sidewall 133.

Figure 4:
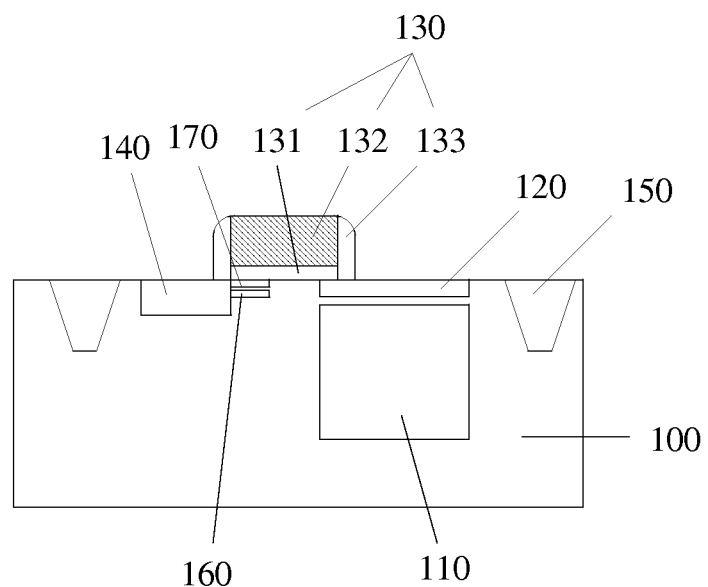

In the step D, referring to FIG. 4, a floating diffusion region 140 which is second-conductive-type heavily-doped is formed by a doping process, the floating diffusion region 140 contacting with the second-conductive-type lightly-doped region 170.

In some embodiments, before the floating diffusion region 140 is formed, a second-conductive-type light doping process may be performed. And then a second-conductive-type heavy doping process may be performed to form the floating diffusion region 140. The floating diffusion region 140 may contact with the first-conductive-type lightly-doped region 160 and the second-conductive-type lightly-doped region 170, and may be disposed on one side of the second-conductive-type lightly-doped region 170 which is away from the first-conductive-type isolating layer 120.

In above embodiments, the first-conductive-type lightly-doped region 160 and the second-conductive-type lightly-doped region 170 are formed in the first-conductive-type semiconductor substrate 100 under the gate structure 130, and contact with the floating diffusion region 140. When the gate structure 130 is opened, photo-induced carriers in the photo diode are transmitted into the floating diffusion region 140 through a channel. Due to the second-conductive-type lightly-doped region 170, a distance between the floating diffusion region 140 and the photo diode is shortened, that is, a channel length is shortened. Thus, transmission efficiency of the photo-induced carriers may be improved.

Besides, the first-conductive-type lightly-doped region 160 which is formed under the second-conductive-type lightly-doped region 170 may prevent the second-conductive-type lightly-doped region 170 from being directly conductive with the photo diode when the gate structure 130 is closed (i.e., the channel is closed).

In an embodiment, an image sensor is provided. Referring to FIG. 4, the image sensor may be formed by the above method. Thus, some related information can be found in above embodiments.

The image sensor includes the first-conductive-type semiconductor substrate 100, photo diodes (i.e., the second-conductive-type region 110), the first-conductive-type isolating layer 120, the gate structure 130 of a transfer transistor and the floating diffusion region 140.

The gate structure 130 of the transfer transistor is formed on a surface of the first-conductive-type semiconductor substrate 100. The first-conductive-type isolating layer 120 and the floating diffusion region 140 are formed in the first-conductive-type semiconductor substrate 100 on two sides of the gate structure 130, respectively.

The photo diodes are formed under the first-conductive-type isolating layer 120 in the first-conductive-type semiconductor substrate 100, and include the second-conductive-type region 110 in the first-conductive-type semiconductor substrate 100. That is, the photo diodes may be formed by forming the second-conductive-type region 110 in the first-conductive-type semiconductor substrate 100. The second-conductive-type region 110 may serve as a region for collecting photo-induced carriers. In some embodiments, the photo-induced carriers may include electrons or electron holes. In the embodiment, the photo-induced carriers include electrons.

In the embodiment, the photo-induced carriers include electrons. Thus, the first-conductive-type is P type, and the second-conductive-type is N type. Therefore, the first-conductive-type semiconductor substrate 100 may be doped with P-type dopant, such as boron. In some embodiments, the photo-induced carriers may include electric holes, thus, the first-conductive-type is N type, and the second-conductive-type is P type.

In some embodiments, the image sensor may be a Charge-coupled Device (CCD) image sensor or a Complementary Metal Oxide Semiconductor (CMOS) image sensor. Except for the structure shown in FIG. 1, the image sensor may further include other components, such as a resetting transistor and a source electrode following transistor. That is, the image sensor may have a 3T structure, a 4T structure or a 5T structure. The image sensor may be a Front Side Illumination (FSI) image sensor or a Back Side Illumination (BSI) image sensor.

In some embodiments, the first-conductive-type semiconductor substrate 100 may be a silicon substrate, a semiconductor substrate including an epitaxy layer, or a SOI substrate. In some embodiments, the first-conductive-type semiconductor substrate 100 may include at least one selected from silicon carbide, gallium arsenide, indium arsenide, indium phosphide, silicon germanium, silicon germanium carbide, gallium arsenide phosphide and gallium indium phosphide. The first-conductive-type semiconductor substrate 100 may be doped with first-conductive-type ions.

In some embodiments, the first-conductive-type isolating layer 120 may be formed on the photo diodes (i.e., the second-conductive-type region 110) in the first-conductive-type semiconductor substrate 100. The first-conductive-type isolating layer 120 can prevent current caused by surface defect of the first-conductive-type semiconductor substrate 100 to a certain extent, therefore, information output from the photo diodes may be more accurate and images generated may be undistorted.

In some embodiments, the floating diffusion region 140 is second-conductive-type heavily-doped. The floating diffusion region 140 may be adapted to receive photo charges from the photo diodes as an input node, and transmit the photo charges to other transistors to perform signal amplification and reading to form corresponding image signals.

In some embodiments, the gate structure 130 of the transfer transistor includes the gate oxide layer 131, the gate layer 132 and the gate sidewalls 133. The gate oxide layer 131 is formed on the surface of the first-conductive-type semiconductor substrate 100, the gate layer 132 is formed on a surface of the gate oxide layer 131, and the gate sidewalls 133 are formed on two sides of the gate oxide layer 131 and the gate layer 132. In some embodiments, the gate oxide layer 131 may include silicon oxide, a high-K dielectric material, silicon nitride or a low-K dielectric material. In the embodiments, the gate oxide layer 131 includes silicon oxide. In some embodiments, the gate layer 132 may include (doped) polysilicon or a metal. In the embodiment, the gate layer 132 includes polysilicon. In some embodiments, the gate sidewalls 133 may include silicon oxide, silicon nitride or silicon oxynitride. In the embodiments, the gate sidewalls 133 include silicon nitride.

In some embodiments, the image sensor further includes the second-conductive-type lightly-doped region 170 and the first-conductive-type lightly-doped region 160. The second-conductive-type lightly-doped region 170 is formed in the first-conductive-type semiconductor substrate 100, and the first-conductive-type lightly-doped region 160 is formed under the second-conductive-type lightly-doped region 170. At least a portion of the second-conductive-type lightly-doped region 170 and at least a portion of the first-conductive-type lightly-doped region 160 are formed under the gate structure 130 of the transfer transistor. The second-conductive-type lightly-doped region 170 and the first-conductive-type lightly-doped region 160 contact with the floating diffusion region 140.

To prevent the second-conductive-type lightly-doped region 170 from being directly conductive with the second-conductive-type region 110, the first-conductive-type lightly-doped region 160 is formed under the second-conductive-type lightly-doped region 170, so that the second-conductive-type lightly-doped region 170 is isolated from the second-conductive-type region 110.

In some embodiments, the second-conductive-type lightly-doped region 170 and the first-conductive-type lightly-doped region 160 may have self-alignment feature. The second-conductive-type lightly-doped region 170 and the first-conductive-type lightly-doped region 160 can be formed using a same mask plate, which enables them to have self-alignment feature.

In some embodiments, the image sensor further includes the first-conductive-type isolating ring 150 which is formed in the first-conductive-type semiconductor substrate 100 and surrounds a periphery of the photo diodes. The first-conductive-type isolating ring 150 may be adapted to prevent inter crosstalk of charge carriers in adjacent photo diodes. In some embodiments, the first-conductive-type isolating ring 150 may include at least one selected from silicon oxide, silicon nitride, silicon oxynitride, polyimide and Spin on Glass (SOG).

The first-conductive-type isolating ring 150 may isolate the photo diodes from a periphery region, which may prevent the photo diodes from being influenced by noises generated in the periphery region and thus may improve imaging quality. When incident light is relatively intensive, electrons may be overflowed from the image sensor. If the overflowed electrons are captured by the photo diodes, signal crosstalk may be caused, which may further influence image quality. Therefore, in some embodiments, the first-conductive-type isolating ring 150 may be electrically connected with a high potential to capture the overflowed electrons, and may transmit the captured electrons to the high potential, which may further improve the image quality.

In some embodiments, other structures, such as a pinned layer, may be formed under each of the photo diodes. The first-conductive-type isolating ring 150 may be replaced by a Shallow Trench Isolation (STI) structure or a Local Oxidation of Silicon (LOCOS) isolating structure.

In some embodiments, the second-conductive-type region 110 and the first-conductive-type region 120 may have self-alignment feature. The second-conductive-type region 110 and the first-conductive-type region 120 can be formed using a same mask plate, which enables them to have self-alignment feature.

In some embodiments, the gate structure of the transfer transistor may cover the photo diodes. Thus, when the gate structure is formed, a portion of the first-conductive-type semiconductor substrate on the photo diodes may be prevented from being etched, which may reduce surface defect of the portion of the first-conductive-type semiconductor substrate on the photo diodes, and further avoid a dark current caused by the surface defect. Therefore, performance of the image sensor may be improved.

In some embodiments, the floating diffusion region 140 is heavily-doped, thus, a potential difference between the floating diffusion region 140 and the photo diodes is relatively small, which results in limited transmission efficiency of photo-induced carriers and the photo-induced carriers are prone to spread out. Therefore, in some embodiments, the second-conductive-type lightly-doped region 170 is formed under the gate structure 130 and contacts with the floating diffusion region 140, that is, the second-conductive-type lightly-doped region 170 may act as an epitaxy part of the floating diffusion region 140. Thus, when transmitted in a channel, photo-induced carriers are prone to be attracted by the second-conductive-type lightly-doped region 170 and the floating diffusion region 140 due to electric potential in the channel, which may increase the transmission efficiency of the photo-induced carriers. Besides, the second-conductive-type lightly-doped region 170 may serve as a "bridge" to shorten a distance between the floating diffusion region 140 and the photo diodes. And this may enable the photo-induced carriers to enter into the floating diffusion region 140 more rapidly when the gate structure 130 of the transfer transistor is opened to operate, which may further increase transmission efficiency of the photo-induced carriers and reduce signal delay.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A method for manufacturing an image sensor, comprising:

A: forming a second-conductive-type region in a first-conductive-type semiconductor substrate to form a photo diode, wherein the second-conductive-type region serves as a region for collecting photo-induced carriers, and forming a first-conductive-type isolating layer above the photo diode in the first-conductive-type semiconductor substrate;

B: forming a second-conductive-type lightly-doped region and a first-conductive-type lightly-doped region under the second-conductive-type lightly-doped region, wherein the second-conductive-type lightly-doped region is isolated from the second-conductive-type region by the first-conductive-type lightly-doped region, wherein the second-conductive-type lightly-doped region and the first-conductive-type lightly-doped region have a self-alignment feature, and the second-conductive-type lightly-doped region and the first-conductive-type lightly-doped region do not contact the second-conductive-type region and the first-conductive-type isolating layer;

C: forming a gate structure of a transfer transistor on a surface of the first-conductive-type semiconductor substrate by a deposition process and a patterning process, wherein the gate structure covers at least a portion of the second-conductive-type lightly-doped region; and D: forming a floating diffusion region which is second-conductive-type heavily-doped by a doping process, the floating diffusion region contacting with the second-conductive-type lightly-doped region, wherein in the step B, photoresist is coated on the surface of the first-conductive-type semiconductor substrate, a photolithography process is performed on the photoresist using a first mask plate to expose and develop to form a patterned photoresist, an etching process is performed by taking the patterned photoresist as a mask to form a groove on the surface of the first-conductive-type semiconductor substrate, a doping process is performed to a first portion of the first-conductive-type semiconductor substrate which corresponds to the groove to form the first-conductive-type lightly-doped region, an inner side of the groove is etched to enlarge the groove, and a doping process is performed to a second portion of the first-conductive-type semiconductor substrate which corresponds to the enlarged groove to form the second-conductive-type lightly-doped region.

2. The method according to claim 1, wherein in the step A, the second-conductive-type region and the first-conductive-type isolating layer have self-alignment feature.

3. The method according to claim 1, wherein the gate structure covers the first-conductive-type isolating layer and the second-conductive-type lightly-doped region.

4. The method according to claim 1, wherein in the step C, forming the gate structure comprises: forming a gate oxide layer, a gate layer covering the gate oxide layer, gate sidewalls disposed on two sides of the gate layer in turn by a thermal oxidation process and a patterning process.

5. The method according to claim 1, wherein when the first-conductive-type is P type, the second-conductive-type is N type; and when the first-conductive-type is N type, the second-conductive-type is P type.

6. The method according to claim 1, wherein the photo-induced carriers comprise electrons or electron holes.

* * * * *